US006937668B2

(12) United States Patent
Sridharan et al.

(10) Patent No.: US 6,937,668 B2
(45) Date of Patent: Aug. 30, 2005

(54) METHOD OF AND APPARATUS FOR PERFORMING MODULATION

(75) Inventors: Guruswami M. Sridharan, Jacksonville, FL (US); Kartik M. Sridharan, Jacksonville, FL (US)

(73) Assignee: Spectra Wireless, Inc., San Diego, CA (US)

( * ) Notice: Subject to any disclaimer, the term of this patent is extended or adjusted under 35 U.S.C. 154(b) by 871 days.

(21) Appl. No.: 09/819,789

(22) Filed: Mar. 28, 2001

(65) Prior Publication Data

US 2002/0141510 A1 Oct. 3, 2002

(51) Int. Cl.[7] .......................... H04K 1/02; H04L 25/03; H04L 25/49
(52) U.S. Cl. ...................... 375/296; 375/297; 375/300; 455/126
(58) Field of Search ................................. 375/269, 297, 375/300; 332/103, 149, 159, 155, 151; 455/108, 126, 127.2; 330/278, 280

(56) References Cited

U.S. PATENT DOCUMENTS

| | | | | |
|---|---|---|---|---|
| 6,255,912 B1 | * | 7/2001 | Laub et al. | 331/25 |
| 6,285,255 B1 | * | 9/2001 | Luu et al. | 330/149 |
| 6,366,177 B1 | * | 4/2002 | McCune et al. | 332/103 |
| 6,377,784 B2 | * | 4/2002 | McCune | 455/108 |
| 6,411,655 B1 | * | 6/2002 | Holden et al. | 375/269 |
| 6,751,265 B1 | * | 6/2004 | Schell et al. | 375/269 |

FOREIGN PATENT DOCUMENTS

| | | |
|---|---|---|
| EP | 0863607 | 9/1998 |
| EP | 0998088 | 5/2000 |
| EP | 1056248 | 11/2000 |

OTHER PUBLICATIONS

"Consideration on Applying OFDM in a Highly Efficient Power Amplifier", by Liu et al., IEEE Transactions on Circuits and Systems II–II: Analog and Digital Signal Processing, vol. 46, 1999, pp. 1329–1336.

"Sigma–Delta Signal Processing", by Victor da Fonte Dias, Circuits and Systems, 1994. Iscas '94., 1994 IEEE International Symposium on London, UK May 30–Jun. 2, 1994, New York, NY USA, IEEE, US, pp. 421–424.

Proceedings of the 44th Annual Symposium of Frequency Control, 1990, "A Multiple Modulator Fractional Divider", Miller, et al. May 23–25, 1990.

IEEE Journal of Solid–State Cicuits "An Agile ISM Band Frequency Synthesizer with Built–In GMSK Data Modulation", Filiol, et al., Jul. 1998, vol. 33, No. 7.

IEEE Journal of Solid–State Circuits "An IC for Linearizing RF Polwer Amplifiers using Envelope Elimination and Restoration", Su, et al., Dec. 1998, vol. 33, No. 12.

* cited by examiner

Primary Examiner—Phuong Phu
(74) Attorney, Agent, or Firm—Foley & Lardner LLP

(57) ABSTRACT

A modulator and a method of modulating utilizes phase or frequency modulation and amplitude modulation. A delay circuit or synchronization circuit is utilized to coordinate the performance of amplitude modulation and phase modulation. The amplitude modulation can be provided after phase modulation is provided to the signal. The modulation circuit can be utilized in any frequency range including high frequency and low frequency circuits.

20 Claims, 3 Drawing Sheets

METHOD OF AND APPARATUS FOR PERFORMING MODULATION

FIELD OF THE INVENTION

The present invention relates generally to signal generation and modulation. More particularly, the present invention relates to a method of and an apparatus for modulating a signal in accordance with first (e.g., amplitude) and second (e.g., phase) data.

BACKGROUND OF THE INVENTION

Communication systems generally utilize modulation techniques to encode data onto a waveform. Communication systems can include wireless communication systems, cellular communication systems, the global system for mobile communications (GSM), optical networks, local area networks (LANs), wide area networks (WANs), telecommunication networks and other networks. Modulation techniques allow intelligence (e.g., data or information) to be encoded on a carrier wave. Low frequency to very high frequency carrier waves (over several gigahertz (GHz)) can be modulated to provide data or information.

Various modulation techniques have been utilized including digital or analog schemes. Some conventional forms of modulation include, amplitude modulation (AM), frequency modulation (FM), phase modulation (PM), frequency shift keying (FSK), quadrature amplitude modulation (QAM), phase shift keying (PSK), quadrature phase shift keying (QPSK) and hybrids/combinations thereof. Other modulation techniques include minimum shift keying (MSK), binary phase shift keying (BPSK), 16-QAM, code division multiple access (CDMA), time division multiple access (TDMA), etc. The above-mentioned techniques generally adjust the frequency, phase, or amplitude of the carrier wave to encode data onto the carrier wave.

Conventional modulators adjust or generate characteristics of a carrier wave that are varied or selected in accordance with modulating data or information. For example, a signal synthesizer can generate arbitrary modulated waveforms in accordance with digital and/or analog modulation techniques. The modulator can vary a property of an electromagnetic wave or signal, such as its amplitude, frequency or phase, in response to digital data or an analog signal.

Certain conventional modulation schemes, such as quadrature modulation (OM), simultaneously modulate a carrier wave in accordance with two distinct bits of data or streams of information. Quadrature modulation digitally encodes multiple data streams independently The two digitally encoded data streams are referred to as an in-phase (I) signal associated with I data and a quadrature (Q) phase signal associated with Q data. The I and Q data can be generated digitally. The combination of the I and Q signal results in a unique two-dimensional signal vector or symbol.

Quadrature modulation conventionally requires that the I signal and Q signal be generated at base band frequency. The base band frequency is up-converted to higher frequencies, such as, radio frequencies (RF) using a mixer. Quadrature modulation requires significant power and requires large discrete filters to remove unwanted mixer up-conversion products. These disadvantages are particularly problematic in mobile wireless communication systems and other applications with small size and low power design requirements.

Conventional wireless systems have utilized an envelope elimination and restoration (EER) technique to amplify an already modulated signal. The EER technique separates a phase modulated signal and an amplitude modulated signal from the already modulated high frequency signal. After separation, the phase modulated signal and the amplitude modulated signal are amplified in distinct circuit paths and recombined after amplification.

The envelope elimination and restoration scheme allows more efficient amplification circuits to be employed. Although the system allows more efficient amplification, conventional systems have not been able to use this technique in modulation schemes because generating precise phase modulation is difficult and applying phase and amplitude modulation in synchronism is difficult. Inaccurate timing results inaccurate data being encoded on the carrier signal. An EER technique is discussed in McFarland, "An IC for Linearizing RF Power Amplifiers Using Envelope Elimination and Restoration," IEEE Journal of Solid State Circuits, Vol. 33, No. 12, (December 1998).

Thus, there is a need for a modulation technique which can efficiently modulate data. Further still, there is a need for a modulation technique that can simultaneously amplitude and phase modulate information onto a carrier wave without requiring significant power or filtering requirements. Yet further, there is a need for an apparatus for and a method of modulating a signal efficiently. Further still, there is a need for a method of and apparatus for generating arbitrary modulated waveforms using phase or frequency modulation and amplitude modulation simultaneously.

SUMMARY OF THE INVENTION

The present invention relates to a method of providing a modulated signal. The method includes providing a phase modulation signal, and providing amplitude modulation to the phase modulation signal. The phase modulation and the amplitude modulation are synchronized with respect to each other.

Another exemplary embodiment relates to a method of modulating first data and second data on a signal. The method includes steps of phase or frequency modulating the signal in accordance with first data, and amplitude modulating the signal in accordance with the second data. The steps of phase or frequency modulating and amplitude modulating are coordinated in time with respect to each other to ensure integrity of the first data and the second data.

Still another exemplary embodiment relates to a modulator. The modulator includes a first data input, a second data input, a frequency or phase modulator circuit, and an amplitude modulator circuit. The frequency or phase modulator circuit is coupled to the first data input and provides modulation in response to first data at the first data input. The amplitude modulator circuit is coupled with the second data input and provides modulation in response to second data at the second data input.

BRIEF DESCRIPTION OF THE DRAWINGS

The invention will become more fully understood from the following detailed description taken in conjunction with the accompanying drawings, wherein like numerals refer to like elements and in which.

DETAILED DESCRIPTION OF THE PREFERRED EMBODIMENTS

Figure 1:
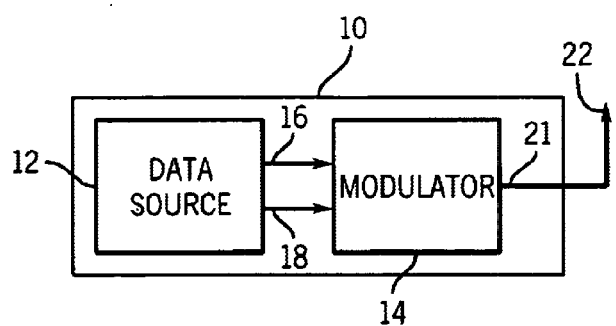
FIG. 1 is a general block diagram of a communication system including a modulator in accordance with an exemplary embodiment.

With reference to FIG. 1, a communication system 10 includes a data source 12 and a modulator 14. Data source 12 and modulator 14 can be part of a transmitter for communication system 10. Communication system 10 can be utilized in any of a variety of communication applications including telecommunication, satellite communication, fiber optic communication, radio communication, microwave communication, cellular telephones, beepers, etc.

In one preferred embodiment, system 10 communicates two data points that represent a symbol or vector. The symbol or vector can represent analog or digital data, voice, video, graphics, sound, etc. Data source 12 provides data at a first input 16 (phase) and data at a second input 18 (amplitude) to modulator 14.

Modulator 14 receives the data provided on inputs 16 and 18 and provides a modulated signal at output 21. The modulated signal can be a radio frequency (RF) signal for transmission over a wireless medium, such as, through an antenna 22. Alternatively, the modulated signal can be provided through a wire, a fiber optic cable or over other mediums.

In one exemplary embodiment, the modulated signal is provided on a carrier wave of approximately 500 Megahertz (MHz) to 6 Gigahertz (GHz). However, system 10 can utilize any of a variety of frequency ranges. The data from data source 12 can include data representative of digital information, analog information, voice, video, graphics, symbols, music, etc. The types of applications associated with communication system 10 are not described herein in a limiting fashion. Modulator 14 can be used in any system for which it is desirous to encode or modulate analog or digital information.

According to one preferred embodiment, modulator 14 advantageously phase modulates the carrier wave in response to data at input 16. Modulator 14 also amplitude modulates the carrier wave in accordance with data on input 18. Modulator 14 can utilize a technique in which data on input 16 is phase modulated onto the carrier wave by modulator 14 followed by modulator 14 amplitude modulating the phase modulated signal based on data at input 18. Any phase modulation scheme can be utilized depending upon design criteria. For example, modulator 14 can use a phase shift keying (PSK), binary phase shift keying (BPSK), or other phase modulation schemes.

According to another preferred embodiment, modulator 14 advantageously frequency modulates the carrier wave in response to data at input 16. Modulator 14 also amplitude modulates the carrier wave in accordance with the data on input 18. Modulator 14 can utilize a technique in which data on input 16 is frequency modulated on the carrier wave by modulator 14 followed by modulator 14 amplitude modulating the frequency modulated signal based on data on input 18. Any frequency modulation scheme can be utilized depending upon design criteria. For example, modulator 14 can use frequency shift keying (FSK), binary frequency shift keying (BFSK), or other frequency modulation schemes.

The modulated signal can be conditioned, filtered, and amplified before modulator 14 provides it to output 21 and antenna 22. For example, heterodyning can be utilized to raise or lower the frequency at which the modulated signal is transmitted. In a most preferred embodiment, modulator 14 directly provides the modulated waveform to antenna 22 after amplitude modulation.

Figure 4:
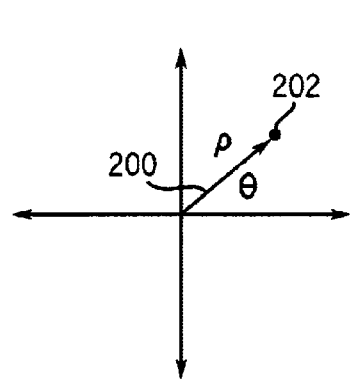
FIG. 4 is a vector diagram showing a symbol or data modulated onto a waveform generated by the modulator illustrated in FIG. 2, wherein the phase modulation and amplitude modulation are synchronized in accordance with a further exemplary embodiment.

With reference to FIG. 4, the modulated data on the carrier wave preferably represents a vector 200. Vector 200 has a magnitude component ρ represented by the amplitude modulation provided by modulator 14 and an angular component θ represented by the phase modulation performed by modulator 14. θ and ρ can define a point such as point 202 in an x-y plane (or I-Q plane).

Figure 2:
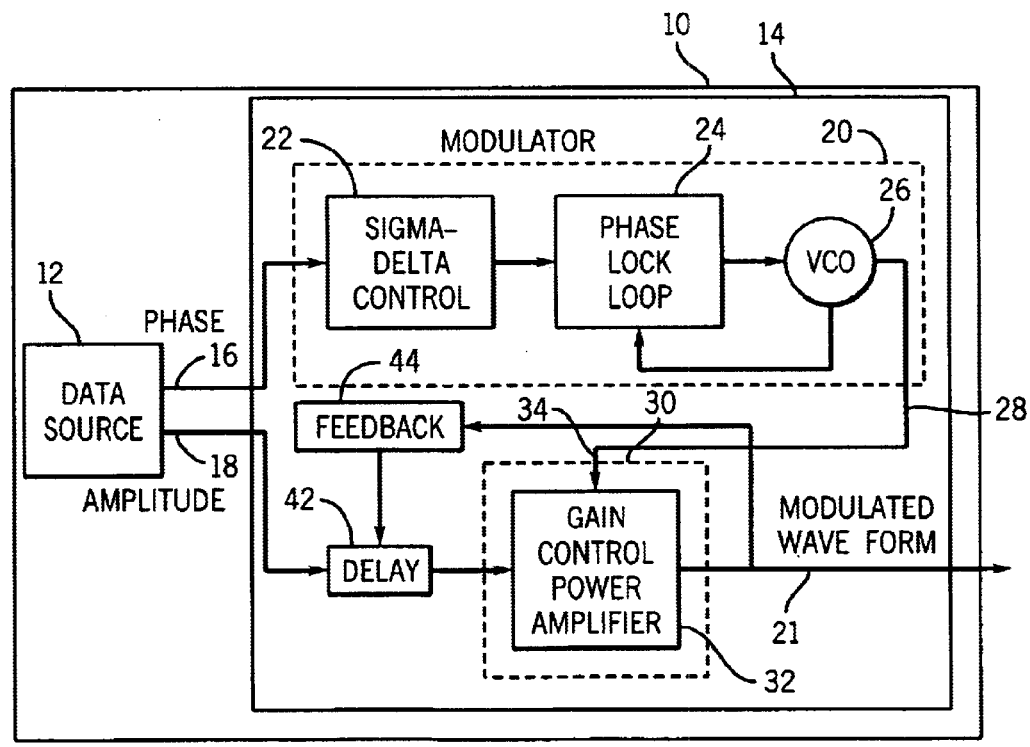
FIG. 2 is a more detailed schematic block diagram of the modulator illustrated in FIG. 1 in accordance with another exemplary embodiment.

With reference to FIG. 2, modulator 14 of communication system 10 includes a phase or frequency modulator circuit 20. Circuit 20 includes sigma delta (ΣΔ) control circuit 22, a phase lock loop (PLL) 24, and a voltage controlled oscillator (VCO) 26. Using a sigma delta control circuit such as circuit 22 provides advantages with respect to the precision and timing of the phase modulation. Sigma delta (ΣΔ) control circuit 22 can also be used to impart frequency modulation. Alternatively, circuit 20 can be replaced with any other circuits which provide precise phase/frequency modulation.

Modulator 14 also includes an amplitude modulation circuit 30. Circuit 30 includes a gain control or power amplifier 32. Modulator 14 further includes a delay circuit 42 and a feedback circuit 44.

In operation, data source 12 provides phase and amplitude data to modulator 14. Phase data is modulated onto a carrier wave using modulator circuit 20. Preferably, the phase data is phase modulated onto the carrier wave.

Although circuit 20 is shown utilizing a sigma-delta control circuit 22, phase lock loop 24 and voltage controlled oscillator 26, any device for achieving frequency or phase modulation can be utilized for circuit 20. One method for phase modulation circuits that can be utilized as circuit 20 are described in Filliol, "An Agile ISM Band Frequency Synthesizer With Built-in GMSI Data Modulation," *IEEE Journal of Solid State Circuits*, Vol. 33, November 7, July 1998. Phase modulator circuit 20 shown in FIG. 2 is capable of extremely fine phase and/or frequency control.

Sigma delta control circuit 22 effects precise phase or frequency modulation via loop 24 and oscillator 26. Alternatively, any frequency or phase modulation circuit capable of relatively precise modulation can be utilized. A modulation circuit that uses sigma delta control circuit 22 is not mandatory.

The phase or frequency modulated signal is provided from phase modulator circuit 20 at output 28 to an input 34 of amplitude modulator circuit 30. Circuit 30 receives the phase or frequency modulated signal from circuit 20 and amplifies the signal in accordance with amplitude data at input 18. The amplitude data at input 18 is provided through delay circuit 42 to gain control or power amplifier 32. Gain control or power amplifier 32 provides the modulated waveform (both frequency or phase modulated and amplitude modulated) to output 21.

Gain control or power amplifier 32 can be a power amplifier having a variable power supply voltage. Alternatively, amplifier 32 can be a variable gain amplifier having a control input that controls the gain of the amplifier. Preferably, the amplitude of the modulated wave signal at output 21 is directly proportional to the amplitude data. The phase of the modulated signal at output 21 is preferably the same phase as the signal at input 34.

Delay circuit 42 advantageously coordinates or synchronizes the modulation of circuit 20 and circuit 30. Delay circuit 42 can delay the arrival of data from input 18 so it is coordinated with the arrival of the phase or frequency modulated signal from circuit 20.

Figure 5:
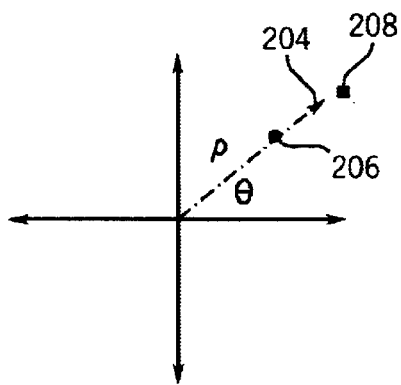
FIG. 5 is a diagram showing a symbol or data encoded on the modulated waveform by the modulator illustrated in FIG. 2, wherein the amplitude modulation and phase modulation are not synchronized.

Uncoordinated or unsynchronized modulation is illustrated with reference to FIG. 5, wherein a vector 204 for a desired point 206 (similar to point 202 in FIG. 4) is shown. However, vector 204 represents a data point associated with rectangle 208 rather than desired point 206. The failure of vector 204 to symbolize desired point 206 is a result of a mismatch between the modulation associated with θ and the modulation associated with ρ. The modulation associated with θ and the modulation associated with ρ must be precisely timed in order to represent the desired point 206 (point 202 in FIG. 4). Accordingly, delay circuit 42 ensures that the amplitude modulation corresponds to the appropriate phase modulation for the modulated waveform.

Feedback circuit 44 operates to calibrate delay circuit 42 to ensure that the appropriate delay is provided. In one embodiment, a calibration scheme is utilized at manufacture and/or before operation. If modulator 14 is susceptible to drift, the calibration scheme can be utilized during operation.

For example, feedback circuit 44 can calibrate delay circuit 42 during start-ups when modulator 14 is turned on or periodically during operation. In another alternative, the calibration scheme can be performed after modulator 14 is used for a period of time or is turned on a number of times.

Feedback circuit 44 measures or detects (e.g., upon reset, start-up or at manufacture, etc.) the delay associated with modulated waveform by comparing the modulated waveform with an expected waveform provided by data source 12. Various techniques can be utilized to detect the delay including the technique discussed below with reference to FIG. 6. Circuit 44 can be integrated within modulator 14.

Figure 6:
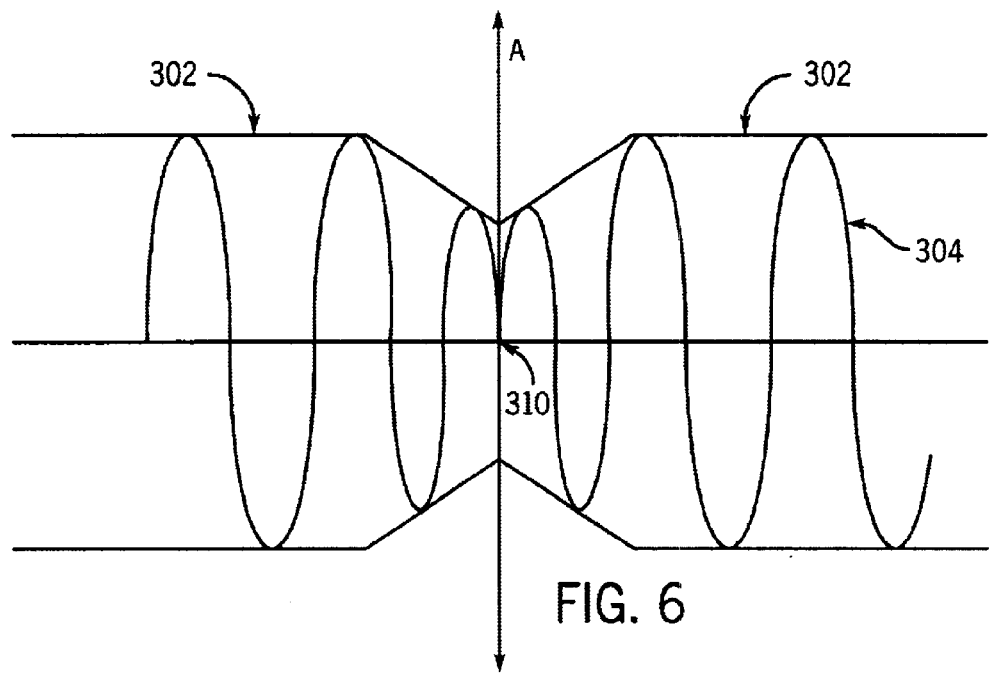
FIG. 6 is a timing diagram of a waveform used to calibrate the modulator illustrated in FIG. 2 in accordance with still another exemplary embodiment.

With reference to FIG. 6, modulator 14 is calibrated by providing data on inputs 16 and 18 so that the amplitude data is minimum at the same time the phase data represents a reversal as shown on modulated wave form or signal 304. Modulated waveform 304 is preferably a filtered binary phase shift keyed signal due to its simplicity for demodulation. Alternatively, any complex modulation waveform can be chosen where a precise timing relationship between phase and amplitude can be easily demodulated.

Figure 7:
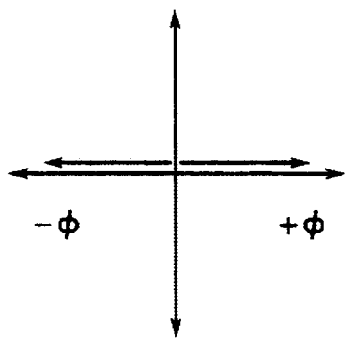
FIG. 7 is a diagram indicating the detection of a delay associated with the modulator illustrated in FIG. 2 in accordance with still another exemplary embodiment.

In FIG. 6, an envelope 302 is associated with modulated signal 304. As modulated signal 304 indicates, an abrupt phase change occurs at a point 310 at which the amplitude modulation is minimum (as represented by envelope 302). Therefore, feedback circuit 44 can measure the difference between the time at which the modulated signal experiences a phase change (point 310) and the time at which the amplitude modulation is minimum (envelope 302 at a minimum). This difference is represented by a delay of plus or minus φ shown in FIG. 7.

Delay circuit 42 provides a delay of plus or minus φ in accordance with the delay measured by feedback circuit 44. Thus, feedback circuit 44 ensures the accuracy of data on the modulated waveform by ensuring the synchronization or coordination between circuits 20 and 30. This scheme advantageously overcomes the difficulties associated with prior art envelope elimination and restoration systems (EERs) which attempted to separately amplify phase and amplitude information.

Once the delay is measured, modulator 14 can be recalibrated to ensure that the amplitude data is minimum at the same time the phase data represents a reversal as shown on modulated signal 304. Circuit 44 can be located within modulator 14 or be a separate circuit that can be connected only during testing and calibration modes. The measurement of delay φ can be assumed to be the result of the phase path and not in the amplitude path. However, the delay φ can also be assumed to be in the amplitude path and not in the phase path, if necessary. An iterative calibration process can be utilized to ensure that modulator 14 accurately compensates for delay φ.

Figure 3:
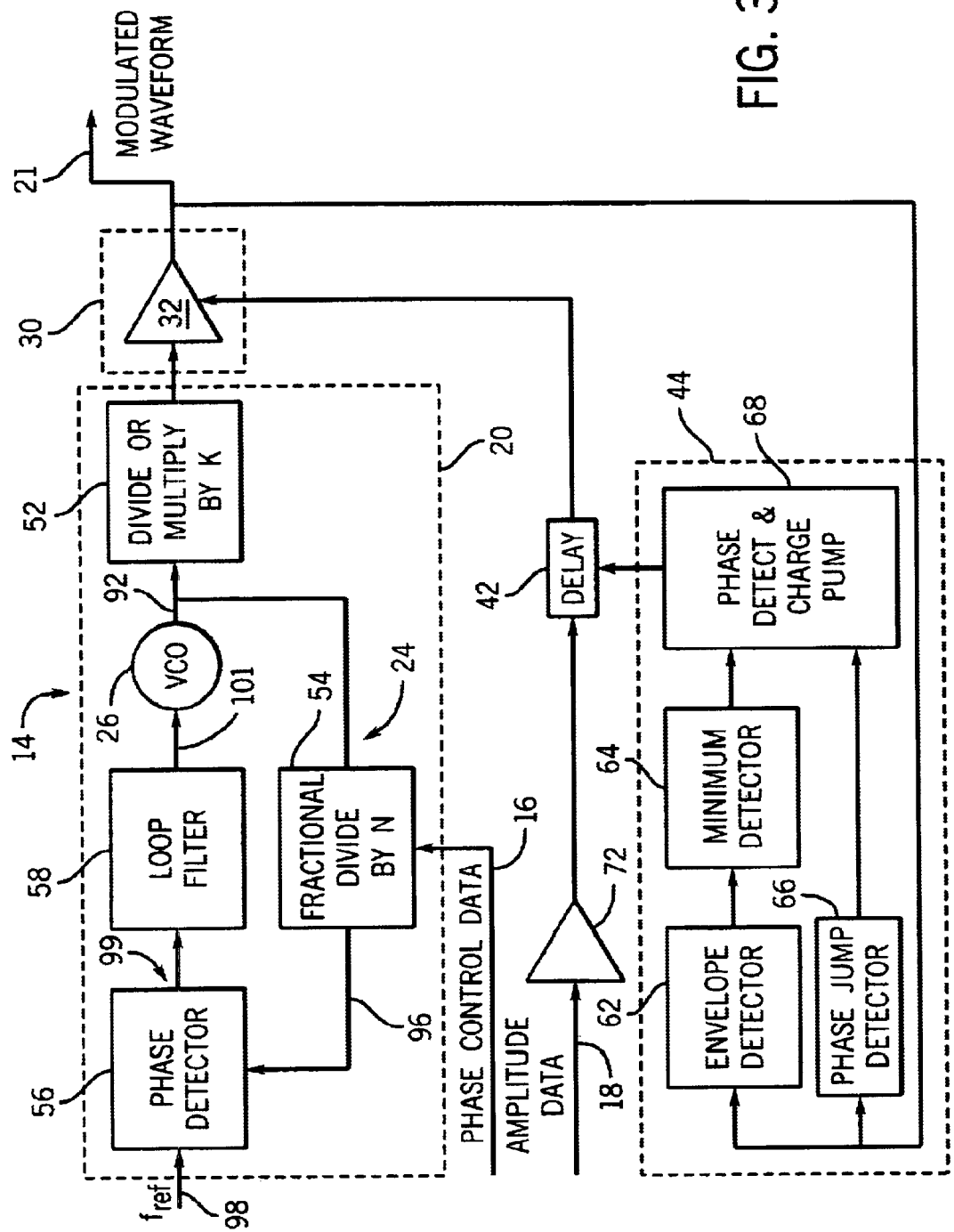
FIG. 3 is an even more detailed schematic block diagram of the modulator illustrated in FIG. 2 in accordance with yet another exemplary embodiment.

With reference to FIG. 3, frequency or phase modulator circuit 20 includes voltage controlled oscillator 26, phase lock loop 24, and a divider 52. Divider 52 can be a divide by K circuit. Alternatively, divider 52 can be a mixer. Phase lock loop 24 includes a fractional divider 54, a phase detector 56 and a loop filter 58. Divider 54 represents control circuit 22 of FIG. 2 plus a divide by N circuit.

Feedback circuit 44 includes an envelope detector 62, a minimum detector 64, a phase jump detector 66 and a phase detect and charge pump circuit 68. A buffer or amplifier 72 is provided between input 18 and delay circuit 42.

Phase lock loop 24 receives phase control data at an input 16. The phase control data can be provided to sigma delta control circuit 22 (FIG. 2). The phase control data is provided to effect phase modulation at an output 92 of voltage controlled oscillator 26. Alternatively, the phase control data can be frequency control data for effecting frequency modulation.

Phase lock loop 24 is employed to enable the use of lower reference frequency to lock the phase of the signal from VCO 26. Phase lock loop circuit 24 utilizes a conventional phase comparison and filtering scheme to effect phase modulation. For example, phase control data input 16 is provided to fractional divide by N circuit divider 54 to impart precise phase modulation to the signal at output 92.

Preferably, modulator 20 can provide precise phase modulation at radio frequency (RF). In a typical application feedback can be a problem if the frequency of VCO 26 at output 92 is the same as that at output 21. (Note, the signal at output 21 is an amplified version of signal at output 92). To alleviate feedback, a common solution is to generate VCO frequency at a harmonic (e.g., second harmonic) or submultiple harmonics (e.g., half of frequency at output 21) and introduce a divide by K (e.g., 2) or multiply by K (e.g., 2) signal. Thus, the frequency of the signal at output 21 is different than the frequency of the signal at output 92 and the feedback problem is reduced. Alternatively a mixer can be used instead of multiply/divide circuit to keep the VCO frequency and output frequency different.

Phase lock loop 24 may not include every element described below to realize advantages of the present application. In the exemplary embodiment, phase lock loop 24 divides the signal at output 92 using divider 54. Divider 54 provides the divided signal to an input 96 of phase detector 56. Phase detector 56 receives a reference signal at input 98. Phase detector 56 compares the phase associated with the signals at inputs 96 and 98. The result of the comparison at output 99 is provided through loop filter 58 to a control input 101 of voltage controlled oscillator 26.

Oscillator 26 can be centered at integer multiples (e.g., 2) of wanted frequency or at any other off-center RF frequency. The use of loop 24 with sigma delta control circuit 22 advantageously allows fractional division to be achieved. Fractional number of bits can be arbitrarily set in accordance with design considerations. For example, 24 fractional bits can be utilized. Changing the divisor allows frequency or phase modulation to be achieved. For realizing phase modulation, fractional division number is changed every reference period. Frequency modulation can be realized by changing the fractional division number, at every symbol interval.

Voltage controlled oscillator 26 can be any device for providing a signal at a particular frequency in response to a control signal. For example, a yitrium-iron-garnet (YIG)-tuned oscillator can be utilized. Alternatively, other tunable oscillators or voltage controlled oscillators can be utilized, including LC oscillators, tunnel diode oscillators, or crystal oscillators.

Loop filter 58 can be a filter having a low pass frequency response. Filter 58 filters out or attenuates components associated with the reference frequency signal at input 98 or noise at input 99. Loop filter 58 preferably has an adequate band width which allows phase lock loop 24 to operate property.

Divider 52 reduces the frequency of the signal at output 92 by a factor of K. In one preferred embodiment, divider 52 can divide the frequency by a factor of 2.

A buffer 72 receives the amplitude data at input 18 and provides the buffered amplitude data to delay circuit 42. As discussed with reference to FIG. 2, delay circuit 42 synchronizes the amplitude modulation by circuit 30 with the phase modulation of circuit 20 by delaying the amplitude data.

Delay circuit 42 can be embodied as an analog or digital circuit. For example, delay circuit 42 can be a chain of flip-flop devices arranged in accordance with the delay φ sensed by circuit 44. According to another alternative, delay circuit 42 can have a variable electrical length programmed by circuit 44. Any type of circuit can be utilized to provide the appropriate delay between modulation circuit 20 and modulation circuit 30.

Feedback circuit 44 provides calibration for delay circuit 42. According to one particular scheme, feedback circuit 44 receives the modulated signal at output 21 and provides the modulated signal through envelope detector 62 and phase jump detector 66. Envelope detector 62 preserves the amplitude modulation on modulated waveform 20 and removing the phase modulation.

Envelope detector 62 provides a signal representative of envelope 302 (FIG. 4). Minimum detector 64 receives a signal from envelope detector 62 and determines at which point the envelope signal reaches a minimum. Minimum detector 64 provides a signal to phase detect and charge pump circuit 68 when a minimum of the envelope signal is detected. Phase jump detector 66 determines when a reversal of phase occurs on the modulated signal at input 21. When a reversal of phase occurs, phase jump detector 66 provides a signal to phase detect and charge pump circuit 68. Phase detect and charge pump circuit 68 provides a signal to delay circuit 42, representative of the difference in time or delay (plus or minus φ in FIG. 7) between the detection of the minimum of the envelope signal and the reversal of phase. This delay is utilized to program delay circuit 42 to ensure appropriate simultaneous frequency or phase modulation with amplitude modulation.

Envelope detector 62 provides a signal representative of the envelope of the modulated signal at output 21 (e.g., envelope 302, FIG. 6). Envelope detector 62 can be embodied as any circuit for generating envelope 302 from modulated signal 304. For example, detector 62 can be embodied as a diode detector or other conventional detector.

Minimum detector 64 can be embodied as a comparator receiving the envelope signal from envelope detector 62. When the comparator senses a minimum, it provides a signal to phase detect and charge pump 68.

Phase jump detector 66 can be embodied as a phase comparator that compares a previous phase to a present phase. The instant, when phase reversal occurred, is provided to circuit 68.

Phase detect and charge pump circuit 68 can be embodied as a phase detector coupled with a timing circuit. Phase detector can be embodied as a reset set (RS) flip-flop device coupled with a capacitor that is charged according to a difference in phase detected by the phase detector. The signal stored on the capacitor is representative of the delay φ and can be provided to delay circuit 42.

Communication system 10 including modulator 14 can be implemented by discrete components on a printed circuit board. Alternatively, the components associated with modulator 14 are preferably provided as part of an application specific integrated circuit provided on a gallium arsenide or silicon substrate. The design of modulator 14 advantageously requires less circuit components than conventional IQ systems.

In addition, power consumption is significantly lowered using modulator 14. The use of modulator 14 can allow longer battery life for systems using modulator 14 (e.g., longer talk times on cellular phones). Additionally, multi-standard capability (e.g., code division multiple access (CDMA) and (GSM-EDGE) can be realized by using the single solution technique, the technique disclosed in the present application.

Amplifier 32 and the path associated with amplifier 32 can also include delta-sigma or delta modulation. The delta-sigma or delta modulation can provide additional control for timing the amplitude modulation.

It is understood that while the detailed drawings, specific examples, and particular values given provide a preferred exemplary embodiment of the present invention. The preferred exemplary embodiment is for the purpose of illustration only. The method and apparatus of the invention is not limited to the precise details and conditions disclosed. For example, although specific modulation circuits and EER circuits are described, other circuitry can achieve the advantages of the present invention. Various changes may be made to the details disclosed, without departing from the spirit of the invention, which is defined by the following claims.

What is claimed is:

1. A method of providing a modulated signal, the method comprising:

providing a phase modulation signal; and providing amplitude modulation to the phase modulation signal to generate the modulated signal, wherein the phase modulation and amplitude modulation are synchronized, wherein the modulated signal is provided through to a feedback circuit, the feedback circuit delaying the amplitude modulation in response to the modulated signal to synchronize the phase modulation and the amplitude modulation.

2. The method of claim 1, wherein the phase modulation and amplitude modulation are synchronized in accordance with a calibration scheme.

3. The method of claim 2, wherein the calibration scheme includes providing the modulated signal having a desired characteristic wherein the phase modulation is reversed when the amplitude modulation is minimum.

4. The method of claim 3, wherein the calibration scheme utilizes a phase jump detector, an envelope detector, and a minimum detector, the chase jump detector and the envelope detector receiving the modulated signal, the minimum detector receiving an envelope detection signal from the envelope detector to determine the minimum, the phase jump detector determining when the phase modulation is reversed.

5. The method of claim 4, wherein the calibration scheme includes detecting a delay between the phase modulation being reversed and the amplitude modulation being minimum.

6. The method of claim 5, wherein the providing amplitude modulation to the phase modulation signal to generate the modulated signal includes delaying the phase modulation in accordance with the delay.

7. The method of claim 1, wherein the providing amplitude modulation to the phase modulation signal to generate the modulated signal utilizes a gain controlled amplifier.

8. The method of claim 1, wherein the modulated signal is a radio frequency signal.

9. The method of claim 2, wherein the providing a phase modulation signal utilizes a phase lock loop.

10. The method of claim 9, wherein the providing a phase modulation signal utilizes a sigma-delta controlled phase lock loop.

11. A method of modulating first data and second data on a signal, the method comprising steps of:
  phase or frequency modulating the signal in accordance with the first data; and
  amplitude modulating the signal in accordance with the second data, wherein the steps of phase or frequency modulating and amplitude modulating are coordinated in time with respect to each other to ensure integrity of the first data and the second data, wherein the phase or frequency modulations and amplitude modulations are coordinated in time by delaying the amplitude modulating in response to the signal.

12. The method of claim 11, wherein a delay circuit is utilized to coordinate in time the phase or frequency modulating step and the amplitude modulating step.

13. A method of modulating first data and second data on a signal, the method comprising steps of:
  phase or frequency modulating the signal in accordance with the first data; and
  amplitude modulating the signal in accordance with the second data, wherein the steps of phase or frequency modulating and amplitude modulating are coordinated in time with respect to each other to ensure integrity of the first data and the second data, wherein a delay circuit is utilized to coordinate in time the phase or frequency modulating step and the amplitude modulating step, wherein the delay circuit is calibrated by providing the modulated signal having a desired characteristic, the desired characteristic being when the phase modulation is reversed and the amplitude modulation being simultaneously minimum; and detecting a delay between the phase modulation being reversed and the amplitude modulation being minimum.

14. A modulator, comprising:
  a first data input;
  a second data input;
  a frequency or phase modulator circuit coupled to the first data input, the frequency or phase modulator circuit providing modulation in response to first data at the first data input;
  an amplitude modulator circuit coupled to the second data input, the amplitude modulator circuit providing modulation in response to second data at the second data input wherein a delay circuit is disposed between the second data input and the amplitude modulator circuit, the delay circuit responding to a feedback signal associated with a modulated signal to coordinate the modulation in response to the first data and the modulation in response to the second data.

15. The modulator of claim 14, further comprising a delay circuit, the delay circuit compensating for time delay for the frequency or phase modulator circuit and the amplitude modulator circuit.

16. The modulator of claim 14, wherein the amplitude modulator is an amplifier.

17. The modulator of claim 16, wherein the second data controls power provided to the amplifier.

18. The modulator of claim 15, wherein the frequency or phase modulator circuit receives an incoming signal and provides a modulated signal to the amplitude modulator circuit.

19. The modulator of claim 18, wherein the delay circuit is coupled between the second input and the amplitude modulator circuit.

20. A modulator, comprising:
  a first data input;
  a second data input;
  a frequency or phase modulator circuit coupled to the first data input, the frequency or chase modulator circuit providing modulation in response to first data at the first data input;
  an amplitude modulator circuit coupled to the second data input, the amplitude modulator circuit providing modulation in response to second data at the second data input; and
  a delay circuit, the delay circuit compensating for time delay for the frequency or phase modulator circuit, wherein the amplitude modulator circuit further comprises an envelope detector coupled to the amplitude modulator circuit, a minimum detector coupled to the envelope detector, a phase jump detector coupled to the amplitude modulator circuit, and a phase detector/charge pump circuit coupled to the phase jump detector and the minimum detector, the phase detector/charge pump circuit providing a delay signal during calibration of the modulator.

* * * * *

UNITED STATES PATENT AND TRADEMARK OFFICE
CERTIFICATE OF CORRECTION

PATENT NO. : 6,937,668 B2
DATED : August 30, 2005
INVENTOR(S) : Guruswami M. Sridharan and Kartik M. Sridharan It is certified that error appears in the above-identified patent and that said Letters Patent is hereby corrected as shown below:

Column 9,
Line 15, please replace "chase" with -- phase --.

Column 10,
Line 43, please replace "chase" with -- phase --.

Signed and Sealed this

Twenty-ninth Day of November, 2005

JON W. DUDAS
*Director of the United States Patent and Trademark Office*